United States Patent
Pagaila et al.

(10) Patent No.: US 8,710,635 B2
(45) Date of Patent: Apr. 29, 2014

(54) SEMICONDUCTOR DEVICE AND METHOD OF FORMING DISCONTINUOUS ESD PROTECTION LAYERS BETWEEN SEMICONDUCTOR DIE

(75) Inventors: Reza A. Pagaila, Singapore (SG); Jose A. Caparas, Singapore (SG); Pandi C. Marimuthu, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/560,008

(22) Filed: Jul. 27, 2012

(65) Prior Publication Data

US 2012/0292749 A1   Nov. 22, 2012

Related U.S. Application Data

(62) Division of application No. 12/780,295, filed on May 14, 2010, now Pat. No. 8,258,012.

(51) Int. Cl.
*H01L 23/552* (2006.01)
*H01L 21/00* (2006.01)

(52) U.S. Cl.
USPC ............. 257/659; 438/113; 257/E23.114; 257/E21.001

(58) Field of Classification Search
CPC ... H01L 21/00; H01L 23/552; H01L 27/0248; H01L 23/60
USPC ........... 257/659, E23.114, E21.001; 438/113
See application file for complete search history.

(56) References Cited

U.S. PATENT DOCUMENTS

| | | | |
|---|---|---|---|
| 5,250,843 A | 10/1993 | Eichelberger | |
| 5,353,498 A | 10/1994 | Fillion et al. | |
| 5,644,167 A * | 7/1997 | Weiler et al. | 257/777 |
| 5,841,193 A | 11/1998 | Eichelberger | |
| 7,619,901 B2 | 11/2009 | Eichelberger et al. | |
| 2007/0020814 A1* | 1/2007 | Hembree et al. | 438/124 |
| 2008/0265421 A1* | 10/2008 | Brunnbauer et al. | 257/758 |
| 2008/0272504 A1 | 11/2008 | Do et al. | |
| 2010/0148381 A1* | 6/2010 | Mahler et al. | 257/794 |

* cited by examiner

*Primary Examiner* — Marc Armand
(74) *Attorney, Agent, or Firm* — Robert D. Atkins; Patent Law Group: Atkins & Associates, P.C.

(57) ABSTRACT

A semiconductor wafer has a plurality of semiconductor die separated by a saw street. The wafer is mounted to dicing tape. The wafer is singulated through the saw street to expose side surfaces of the semiconductor die. An ESD protection layer is formed over the semiconductor die and around the exposed side surfaces of the semiconductor die. The ESD protection layer can be a metal layer, encapsulant film, conductive polymer, conductive ink, or insulating layer covered by a metal layer. The ESD protection layer is singulated between the semiconductor die. The semiconductor die covered by the ESD protection layer are mounted to a temporary carrier. An encapsulant is deposited over the ESD protection layer covering the semiconductor die. The carrier is removed. An interconnect structure is formed over the semiconductor die and encapsulant. The ESD protection layer is electrically connected to the interconnect structure to provide an ESD path.

25 Claims, 17 Drawing Sheets

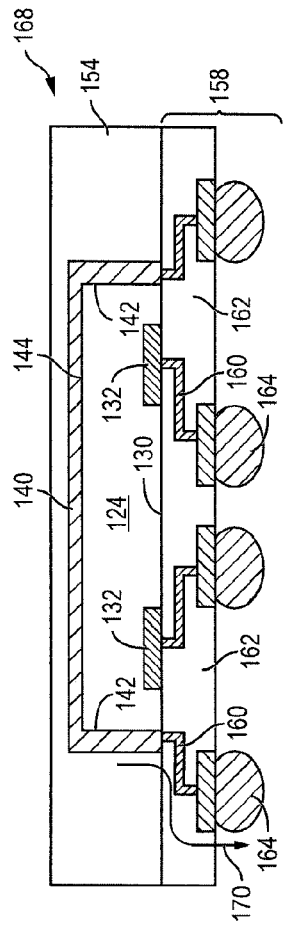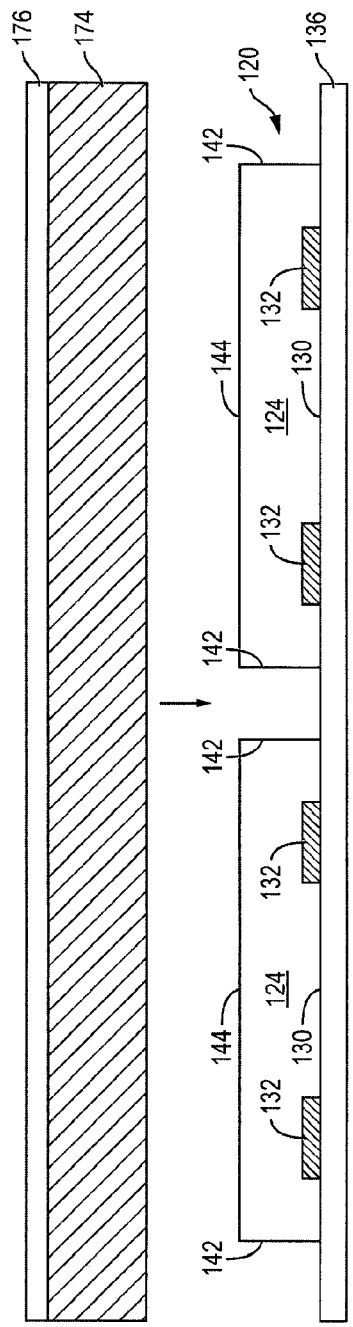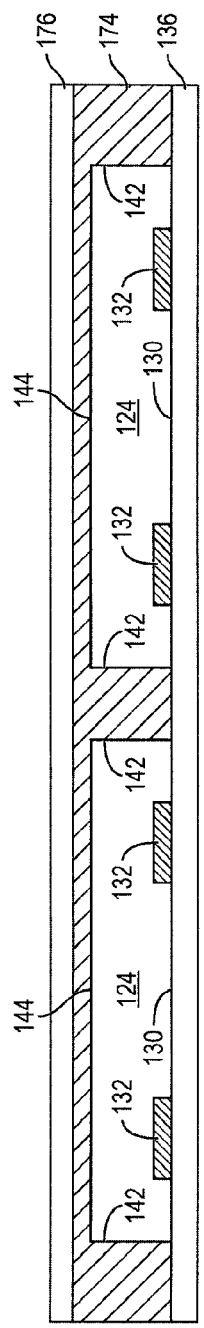

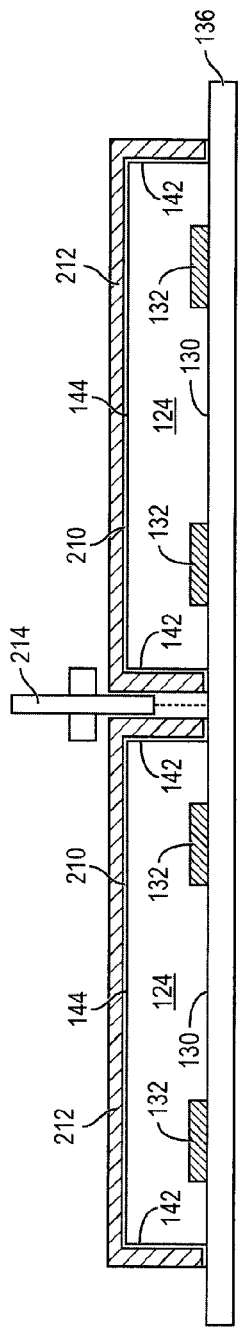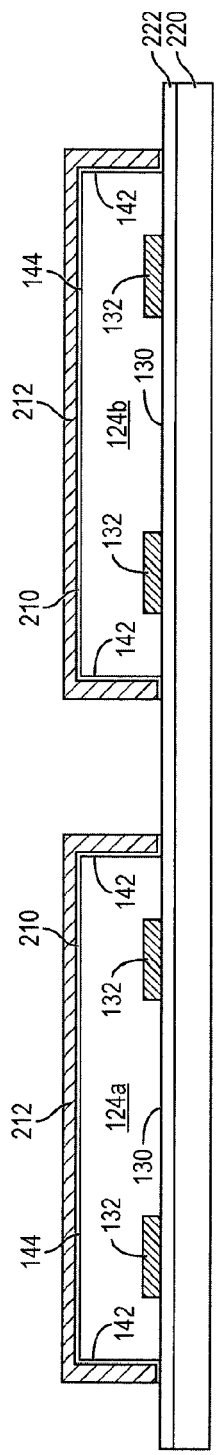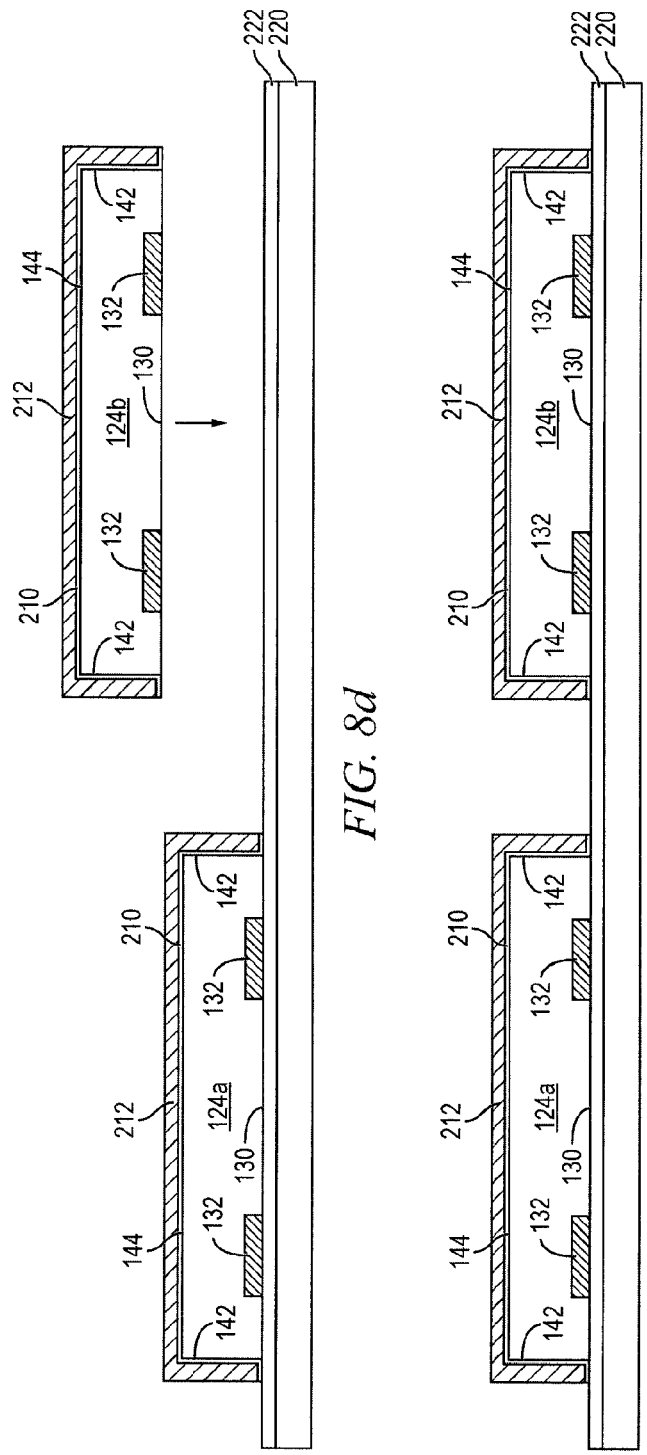
FIG. 8c
FIG. 8d
FIG. 8e

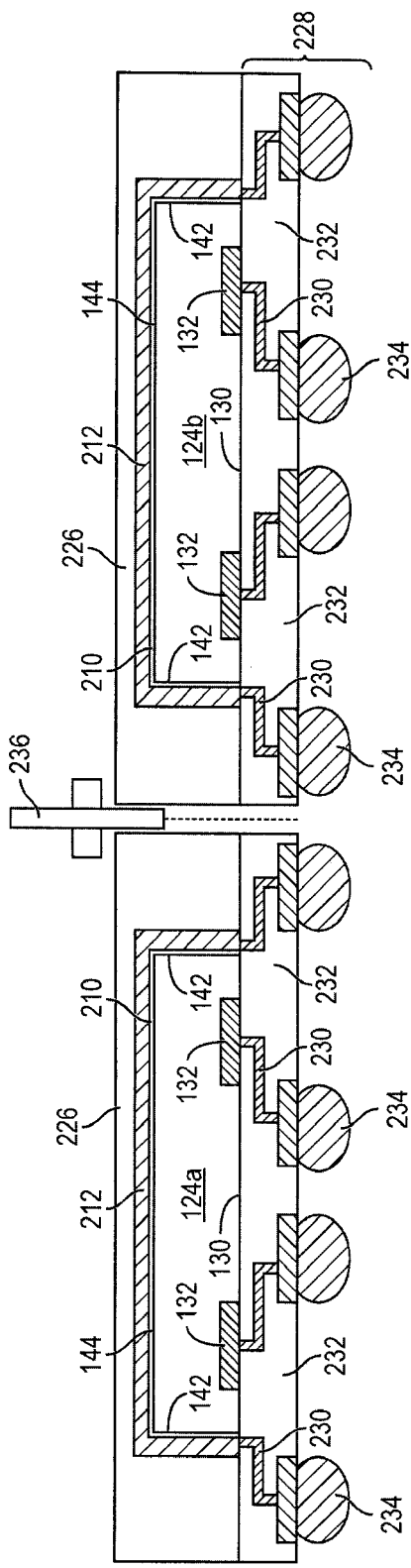
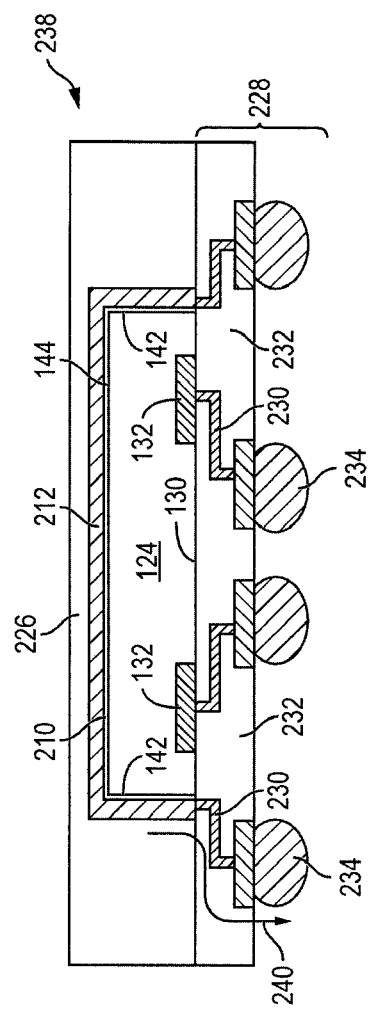
FIG. 8i
FIG. 9

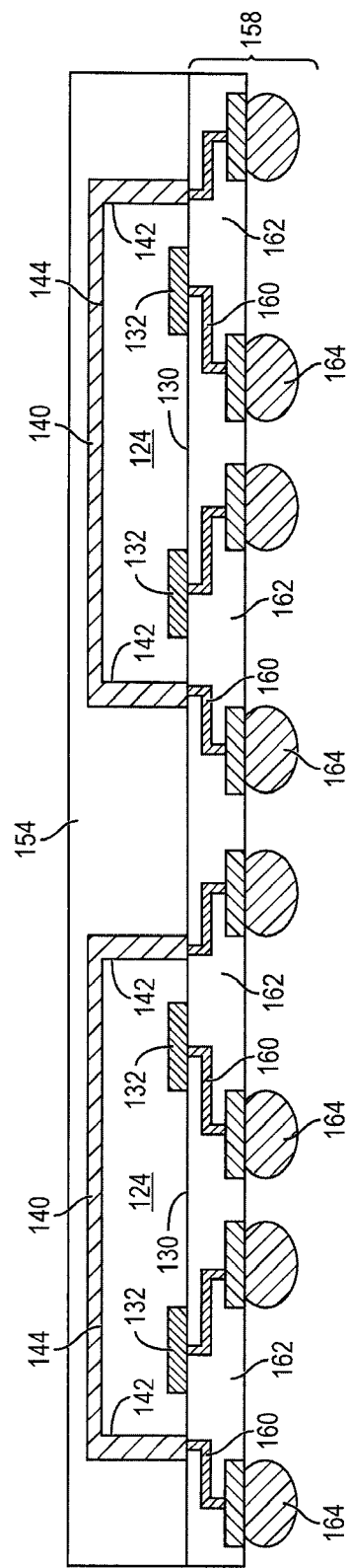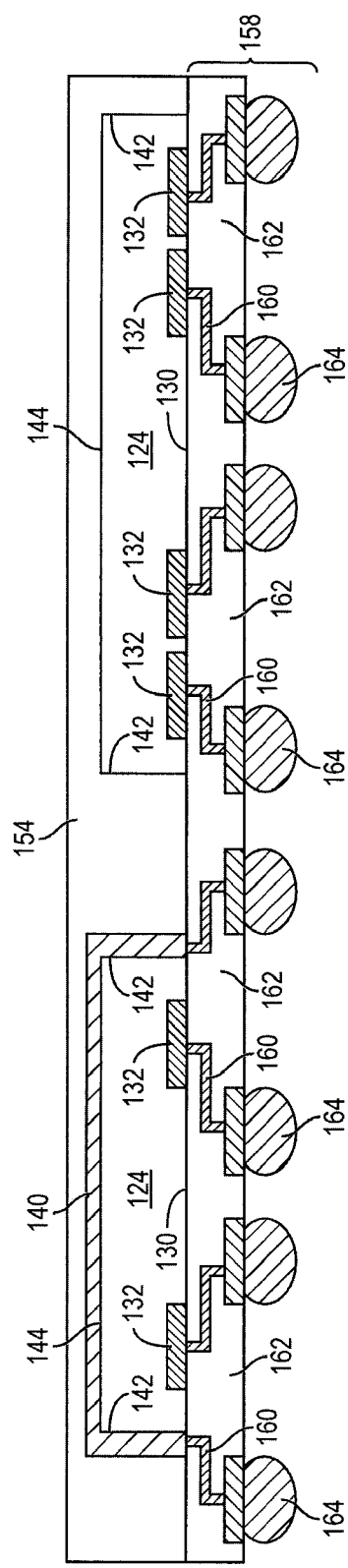

:
SEMICONDUCTOR DEVICE AND METHOD OF FORMING DISCONTINUOUS ESD PROTECTION LAYERS BETWEEN SEMICONDUCTOR DIE

CLAIM TO DOMESTIC PRIORITY

The present application is a division of U.S. patent application Ser. No. 12/780,295, now U.S. Pat. No. 8,258,012, filed May 14, 2010, which application is incorporated herein by reference.

FIELD OF THE INVENTION

The present invention relates in general to semiconductor devices and, more particularly, to a semiconductor device and method of forming discontinuous ESD protection layers between semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Many semiconductor devices are susceptible to damage from electrostatic discharge (ESD). FIG. 1a shows a conventional arrangement with a plurality of semiconductor die 10 having active surface 12 and contact pads 14 mounted to double-sided adhesive layer 16 applied over temporary carrier 18. ESD protection layer 20 is formed over semiconductor die 10. ESD protection layer 20 is a physically and electrically continuous layer formed over semiconductor die 10, as well as area 22 between the semiconductor die. An encapsulant 24 is formed over the semiconductor die 10 and carrier 18. In FIG. 1b, adhesive layer 16 and temporary carrier 18 are removed and a build-up interconnect structure 26 is formed over active surface 12 and encapsulant 24 of semiconductor die 10. ESD protection layer 20 remains as a physically and electrically continuous layer over semiconductor die 10, as well as area 22 between the semiconductor die, during formation of build-up interconnect structure 26.

Electrostatic charges can accumulate when the double-sided adhesive layer 16 and temporary carrier 18 are removed. The electrostatic charges must be removed to avoid shortening the life cycle of semiconductor die 10. An ionizer is commonly used to neutralize the electrostatic charges. However, ionizers add cost to the manufacturing process. ESD protection layer 20 also removes electrostatic charges but requires expensive and time consuming deposition processes, such as chemical vapor deposition (CVD) and sputtering, to form the physically and electrically continuous layer.

SUMMARY OF THE INVENTION

A need exists for cost effective ESD protection scheme for semiconductor die. Accordingly, in one embodiment, the present invention is a semiconductor device comprising a plurality of semiconductor die and ESD protection layer disposed over a first surface of the semiconductor die and around side surfaces of the semiconductor die. The ESD protection layer is discontinuous between the semiconductor die. An encapsulant is deposited over the semiconductor die. An interconnect structure is formed over the encapsulant and a second surface of the semiconductor die opposite the first surface of the semiconductor die. The ESD protection layer is electrically connected to the interconnect structure to provide an ESD path.

In another embodiment, the present invention is a semiconductor device comprising a plurality of semiconductor die and ESD protection layer disposed over a first surface of the semiconductor die and around side surfaces of the semiconductor die. The ESD protection layer is discontinuous between the semiconductor die. An encapsulant is deposited over the semiconductor die.

In another embodiment, the present invention is a semiconductor device comprising a first semiconductor die and ESD protection layer disposed over a first surface of the first semiconductor die and around side surfaces of the first semiconductor die. An encapsulant is deposited over the first semiconductor die. A conductive via is formed through the encapsulant.

In another embodiment, the present invention is a semiconductor device comprising a first semiconductor die and ESD protection layer disposed over a first surface of the first semiconductor die and around side surfaces of the first semiconductor die. The ESD protection layer terminates at the side surfaces of the first semiconductor die. An encapsulant deposited over the first semiconductor die.

BRIEF DESCRIPTION OF THE DRAWINGS

FIG. 5 illustrates the semiconductor die with the discontinuous ESD protection layer formed over its side surfaces and back surface;

FIGS. 6a-6j illustrate a process of forming the discontinuous ESD protection layer as encapsulant film;

FIGS. 8a-8i illustrate a process of forming the discontinuous ESD protection layers as an insulating layer and conductive layer;

FIG. 9 illustrates the semiconductor die with the discontinuous ESD protection layer formed as an insulating layer and conductive layer over its side surfaces and back surface;

FIG. 10 illustrates side-by-side semiconductor die each covered by the discontinuous ESD protection layer;

FIG. 11 illustrates side-by-side semiconductor die, one die covered by the discontinuous ESD protection layer and one die without the ESD protection layer;

DETAILED DESCRIPTION OF THE DRAWINGS

Figure 1A:
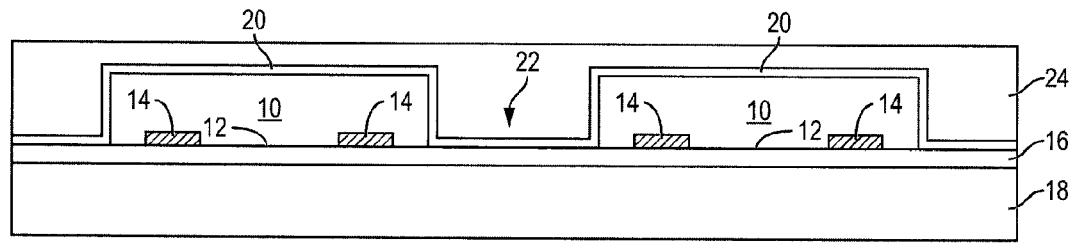
FIGS. 1a-1b illustrate a conventional semiconductor die with a continuous ESD protection layer.
Figure 1B:
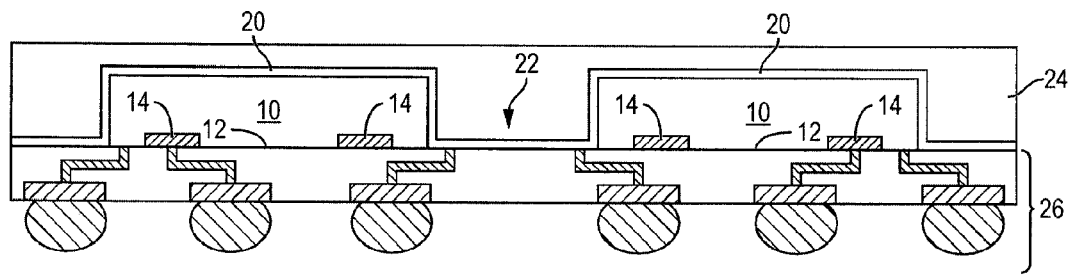

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
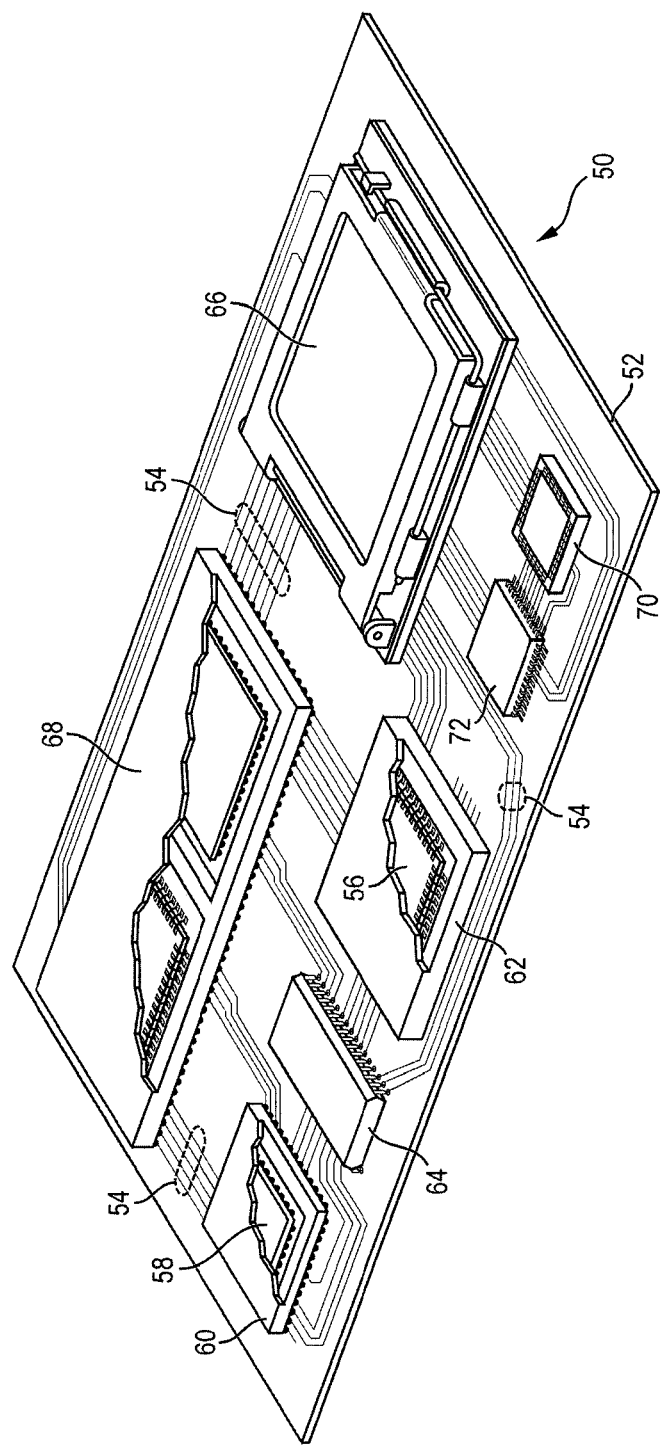
FIG. 2 illustrates a PCB with different types of packages mounted to its surface.

FIG. 2 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 2 for purposes of illustration.

Electronic device 50 may be a stand-alone system that uses the semiconductor packages to perform one or more electrical functions. Alternatively, electronic device 50 may be a sub-component of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 3A:
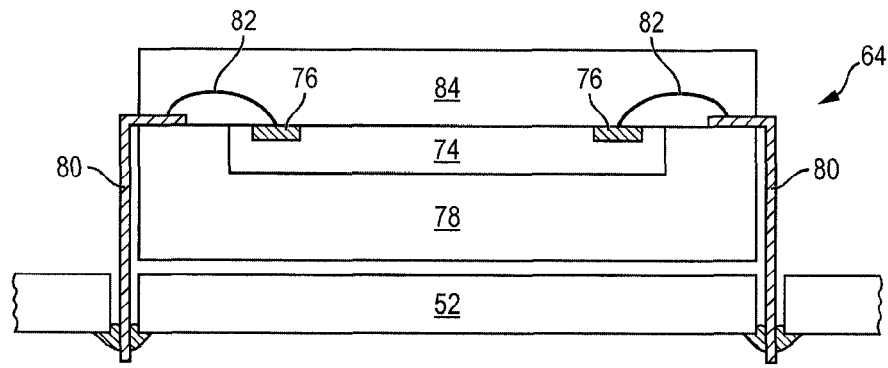
FIGS. 3a-3c illustrate further detail of the representative semiconductor packages mounted to the PCB.
Figure 3B:
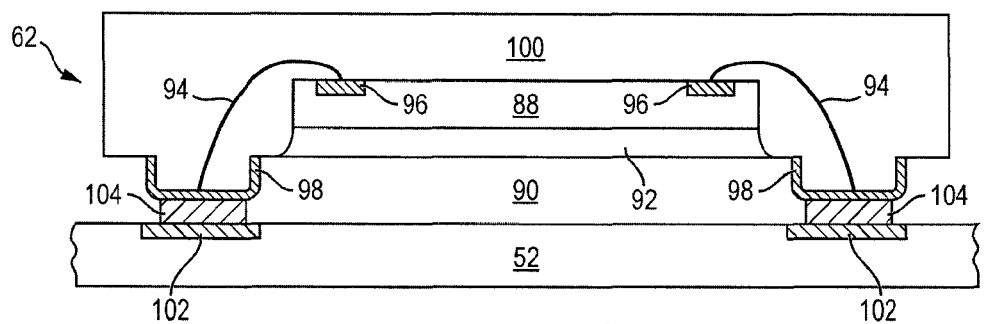
Figure 3C:
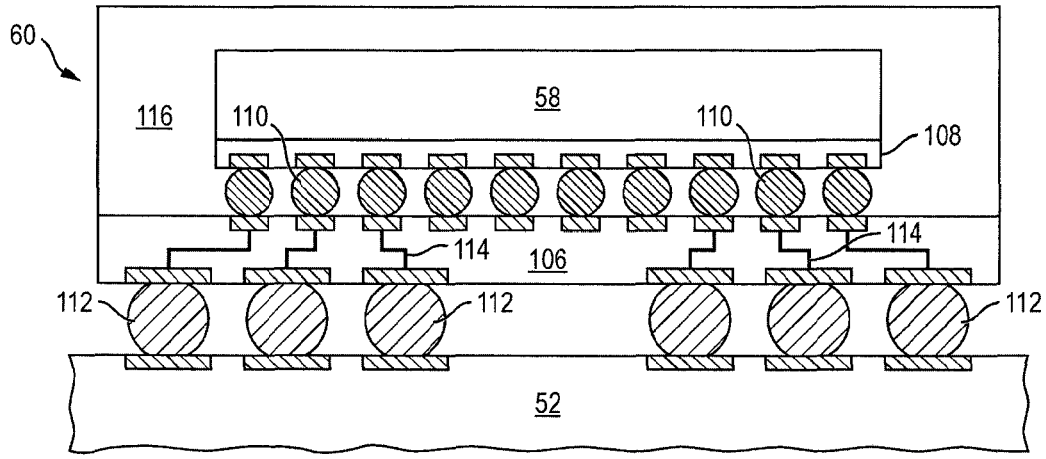

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 3b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 4A:
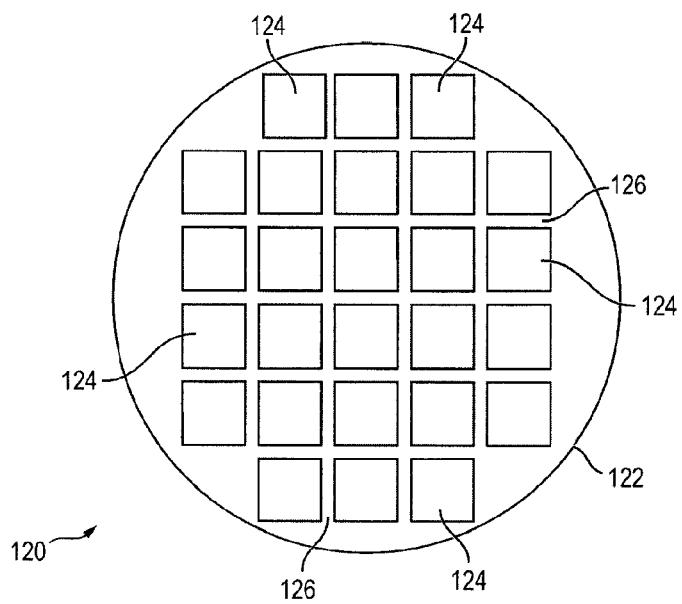
FIGS. 4a-4l illustrate a process of forming discontinuous ESD protection layers over side surfaces and back surface of a semiconductor die.

FIGS. 4a-4l illustrate, in relation to FIGS. 2 and 3a-3c, a process of forming discontinuous ESD protection layers over side surfaces and back surface of a semiconductor die. FIG. 4a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126, as described above.

Figure 4B:
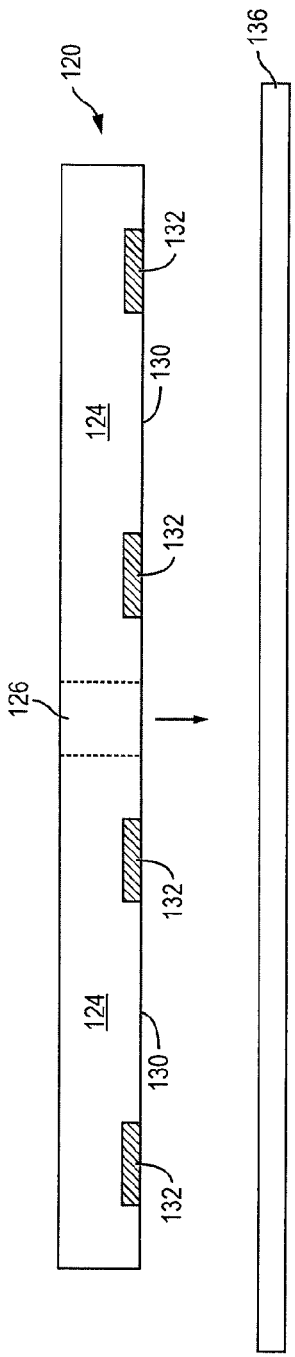

FIG. 4b shows a cross-sectional view of a portion of semiconductor wafer 120. Each semiconductor die 124 has an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain IPDs, such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130.

Figure 4C:
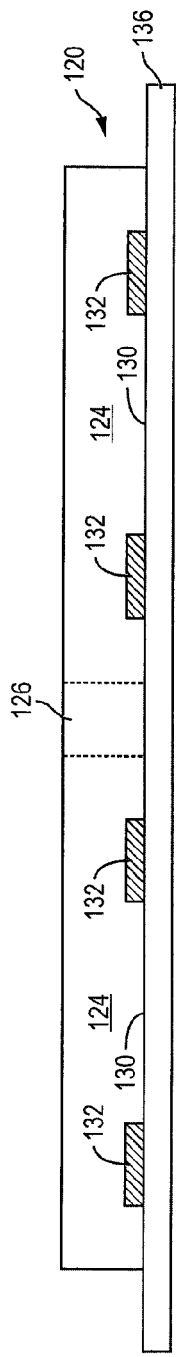
Figure 4D:
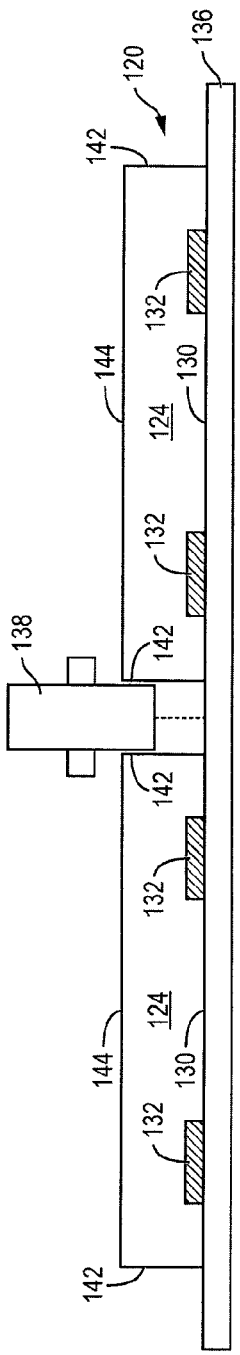

Semiconductor wafer 120 is mounted to dicing tape 136, as shown in FIG. 4c. In FIG. 4d, semiconductor wafer 120 is singulated through saw street 126 down to dicing tape 136 using saw blade or laser cutting tool 138 to expose side surfaces 142 of semiconductor die 124.

Figure 4E:
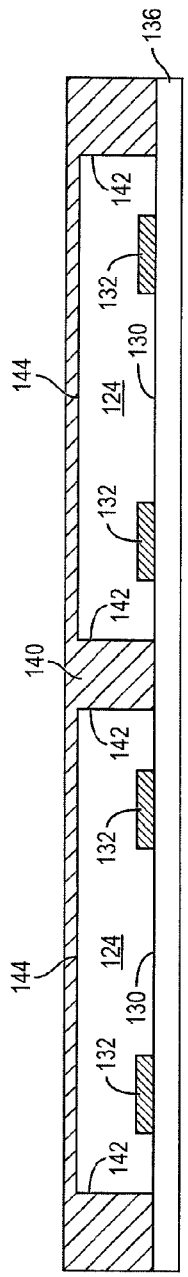

In FIG. 4e, a conductive layer 140 is formed over the exposed side surfaces 142 of semiconductor die 124, i.e., in the singulated saw street 126. Conductive layer 140 is also formed over back surface 144, opposite active surface 130. In one embodiment, conductive layer 140 can be one or more layers Al, Cu, Sn, Ni, Au, Ag, or other suitable electrically conductive material. Conductive layer 140 is formed using electrolytic plating, electroless plating process, or other suitable metal deposition process. In metal form, conductive layer 140 has a thickness of 0.1 to 2.0 micrometers (μm) over back surface 144. Alternatively, conductive layer 140 can be an electrically conductive polymer or electrically conductive ink, i.e., polymer or ink base material with electrically conductive particles, having a thickness less than 100 μm, preferably 20-50 μm. For example, the conductive polymer can be polyacetylene, polyphenylenevinylene, polypyrrole, polythiophene, polyaniline, polyphenylene, or other organic polymer. The conductive polymer or conductive ink is formed by printing, sputtering, or vapor deposition over a metal mesh or other intermediate conductive layer formed over semiconductor die 124. Depending on the material, conductive layer 140 can also be formed by stencil printing, screen printing, spin coating, or needle dispensing. Conductive layer 140 operates as an ESD protection layer for semiconductor die 124.

Figure 4F:
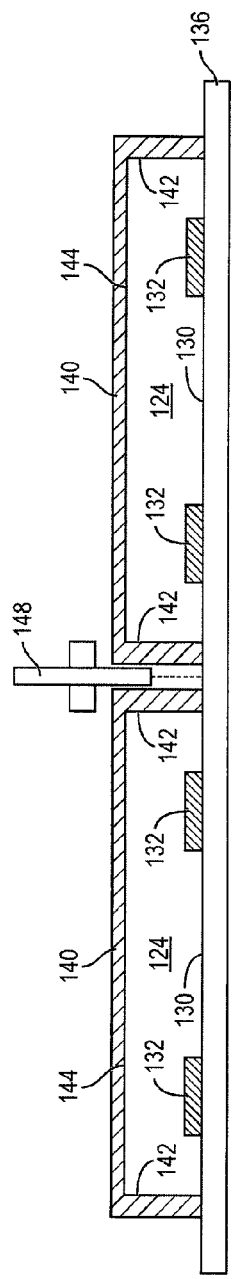

In FIG. 4f, ESD protection layer 140 is singulated between semiconductor die 124 down to dicing tape 136 using saw blade or laser cutting tool 148. Saw blade or laser cutting tool 148 is typically narrower than saw blade or laser cutting tool 138 so that ESD protection layer 140 remains covering side surfaces 142. After singulation, ESD protection layer 140 is discontinuous between semiconductor die 124 while still covering side surfaces 142 and back surface 144 of semiconductor die 124.

Figure 4G:
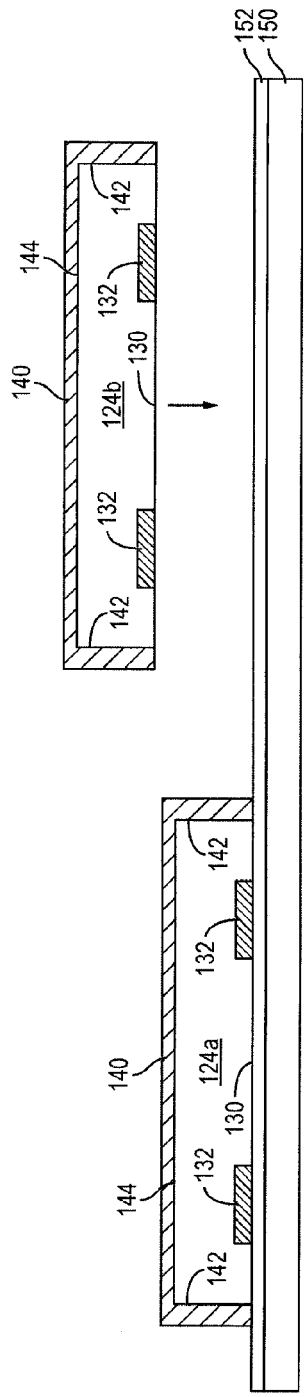

In FIG. 4g, a temporary substrate or carrier 150 contains sacrificial base material such as silicon, polymer, polymer composite, metal, ceramic, glass, glass epoxy, beryllium oxide, or other suitable low-cost, rigid material for structural support. An interface layer or tape 152 is applied over carrier 150 as a double-sided adhesive layer releasable by heat or ultraviolet (UV) light.

Figure 4H:
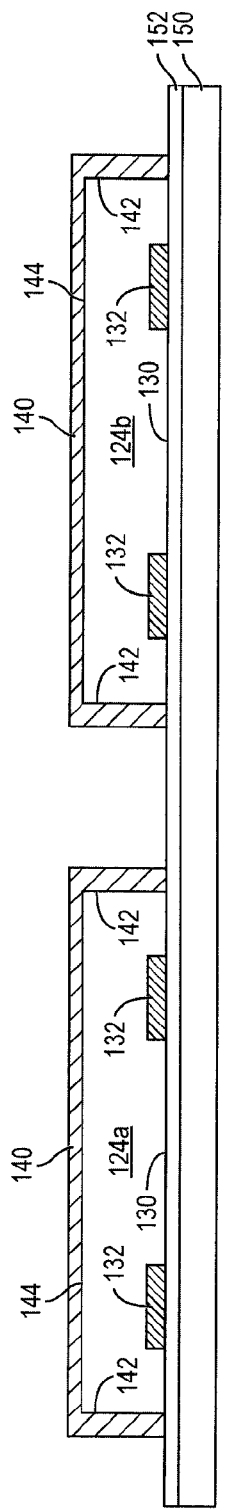

Semiconductor 124a covered by ESD protection layer 140 is removed from dicing tape 136 and mounted to interface layer 152 over carrier 150 using pick and place operation. Likewise, semiconductor 124b covered by ESD protection layer 140 is removed from dicing tape 136 and mounted to interface layer 152, as shown in FIG. 4h. ESD protection layer 140 formed over semiconductor die 124a is discontinuous, i.e., physically separated and electrically isolated, from ESD protection layer 140 formed over semiconductor die 124b. Semiconductor die 124a and 124b, each with a separate and discontinuous ESD protection layer 140, mounted to carrier 150 is referred to as a "reconfigured wafer."

Figure 4I:
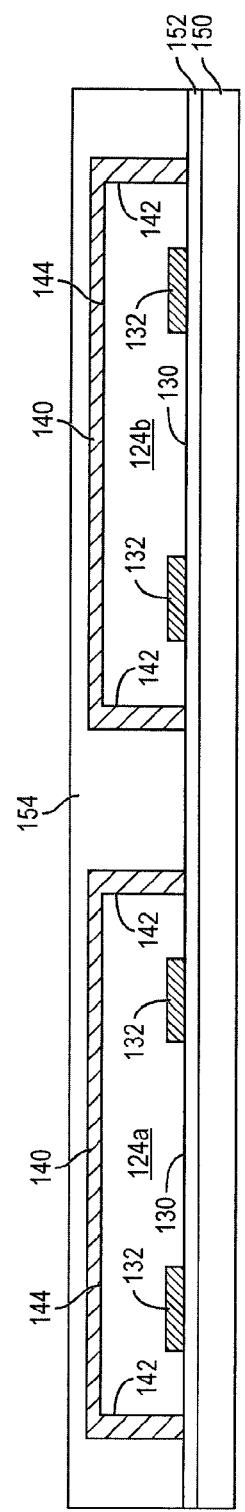

In FIG. 4i, an encapsulant or molding compound 154 is deposited over semiconductor die 124a and 124b and carrier 150 in an amount that covers ESD protection layer 140 formed over side surfaces 142 and back surface 144 of semiconductor die 124a and 124b. Encapsulant 154 is deposited using a paste printing, compressive molding, transfer molding, liquid encapsulant molding, vacuum lamination, spin coating, or other suitable applicator. Encapsulant 154 can be polymer composite material, such as epoxy resin with filler, epoxy acrylate with filler, or polymer with proper filler. Encapsulant 154 is non-conductive and environmentally protects the semiconductor device from external elements and contaminants.

Figure 4J:
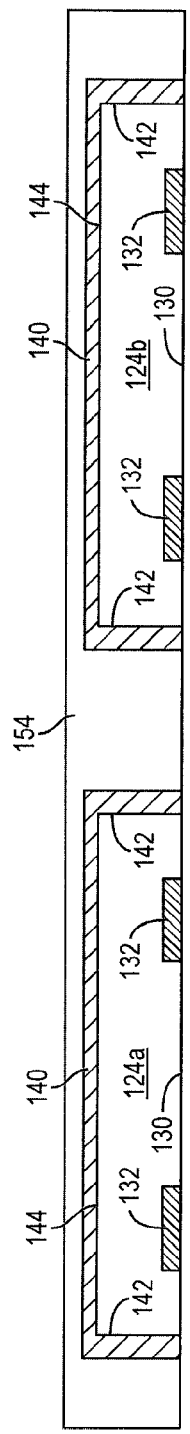

In FIG. 4j, temporary carrier 150 and interface layer 152 are removed by chemical etching, mechanical peel-off, CMP, mechanical grinding, thermal bake, UV light, laser scanning, or wet stripping.

Figure 4K:
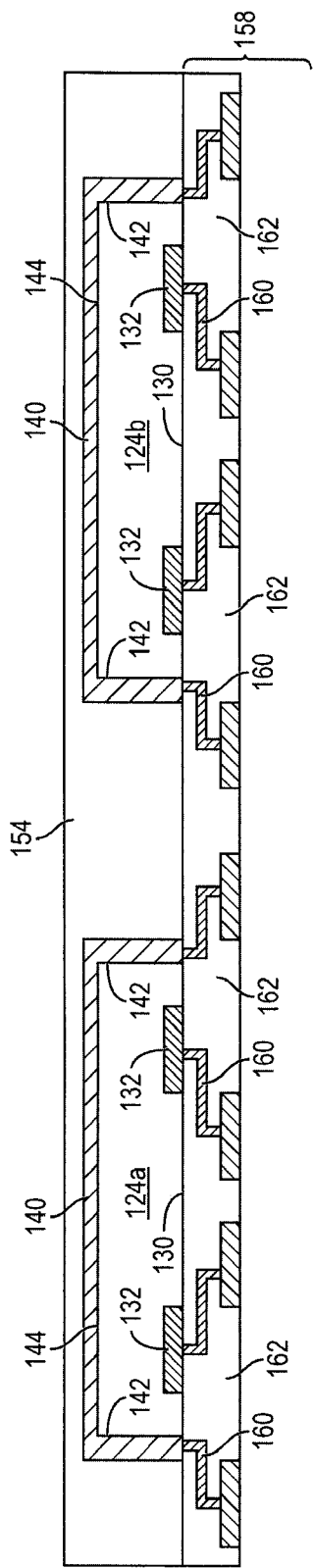

In FIG. 4k, a bottom-side build-up interconnect structure 158 is formed over active surface 130 of semiconductor die 124a and 124b and encapsulant 154. The build-up interconnect structure 158 includes an electrically conductive layer 160 formed using a patterning and metal deposition process such as sputtering, electrolytic plating, and electroless plating. Conductive layer 160 can be one or more layers of Al, Cu, Sn, Ni, Au, Ag, or other suitable electrically conductive material. One portion of conductive layer 160 is electrically connected to contact pads 132 of semiconductor die 124a and 124b. Another portion of conductive layer 160 is electrically connected to ESD protection layer 140 as a low impedance ground point. Other portions of conductive layer 160 can be electrically common or electrically isolated depending on the design and function of the semiconductor device.

The build-up interconnect structure 158 further includes an insulating or passivation layer 162 formed between conductive layers 160 and containing one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 162 is formed using PVD, CVD, printing, spin coating, spray coating, sintering or thermal oxidation.

Figure 4L:
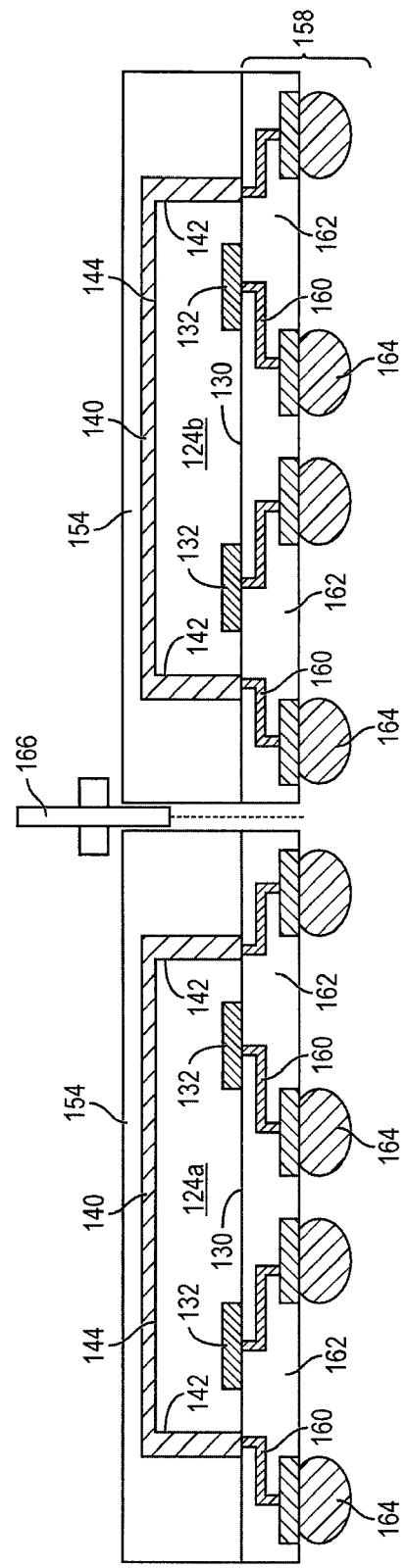

In FIG. 4l, an electrically conductive bump material is deposited over build-up interconnect structure 158 and electrically connected to conductive layer 160 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 160 using a suitable attachment or bonding process. In one embodiment, the bump material is reflowed by heating the material above its melting point to form spherical balls or bumps 164. In some applications, bumps 164 are reflowed a second time to improve electrical contact to conductive layer 160. The bumps can also be compression bonded to conductive layer 160. Bumps 164 represent one type of interconnect structure that can be formed over conductive layer 160. The interconnect structure can also use bond wires, stud bump, micro bump, or other electrical interconnect.

Semiconductor die 124a and 124b are singulated with saw blade or laser cutting tool 166 into individual semiconductor devices.

FIG. 5 shows semiconductor device 168 after singulation. Semiconductor die 124 is electrically connected to build-up interconnect structure 158 and bumps 164. The active and passive circuits formed within active surface 130 of semiconductor die 124 are susceptible to damage from ESD events. Electrostatic charges can accumulate, for example during removal of carrier 150 and interface layer 152. The electrostatic charges must be removed to avoid shortening the life cycle of semiconductor die 124. Conductive layer 140 provides ESD protection for semiconductor die 124 by neutralizing the electrostatic charges. Conductive layer 140 provides an ESD discharge path 170 through conductive layer 160 and bumps 164 to an external low-impedance ground point to safely discharge the electrostatic charges and protect semiconductor die 124. The electrostatic charges migrate toward ESD discharge path 170, which is lower resistance than a path leading to contact pads 132 and active surface 130. By depositing discontinuous ESD protection layer 140 over side surfaces 142 and back surface 144 of each semiconductor die 124, a cost effective deposition process, such as stencil printing, screen printing, spin coating, and needle dispensing, can be used.

In another embodiment, continuing from FIG. 4d, a conductive encapsulant film 174 is applied to tape carrier 176 and positioned over semiconductor die 124, as shown in FIG. 6a. Encapsulant film 174 can be b-staged curable flowable film encapsulant containing fillers such as alumina, copper, carbon black, gold, or platina. For example, the b-staged film can be epoxy resin containing electrically conductive particles and having a thickness less than 100 µm, preferably 20-50 µm. The conductive encapsulant film 174 operates as an ESD protection layer for semiconductor die 124.

Figure 6C:
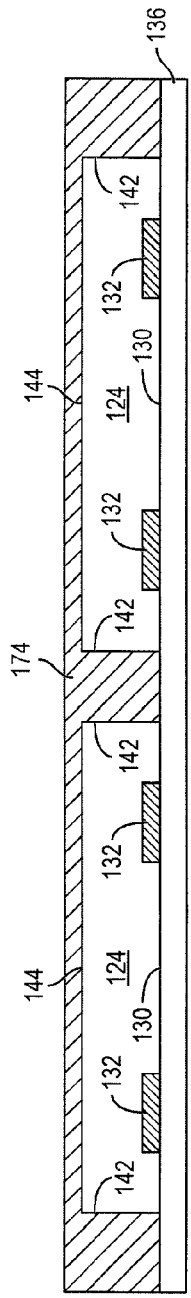
Figure 6D:
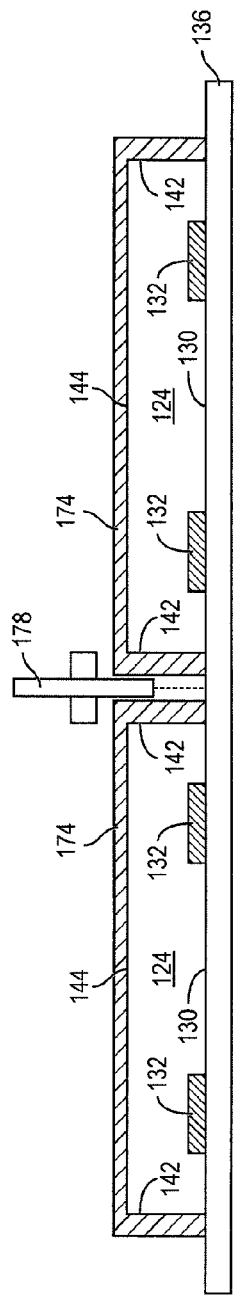

In FIG. 6b, ESD protection layer 174 is laminated over semiconductor die 124. In FIG. 6c, ESD protection layer 174 is cured and tape carrier 176 is removed. In FIG. 6d, ESD protection layer 174 is singulated between semiconductor die 124 down to dicing tape 136 using saw blade or laser cutting tool 178. After singulation, ESD protection layer 174 is discontinuous between semiconductor die 124 while still covering side surfaces 142 and back surface 144 of semiconductor die 124.

Figure 6E:
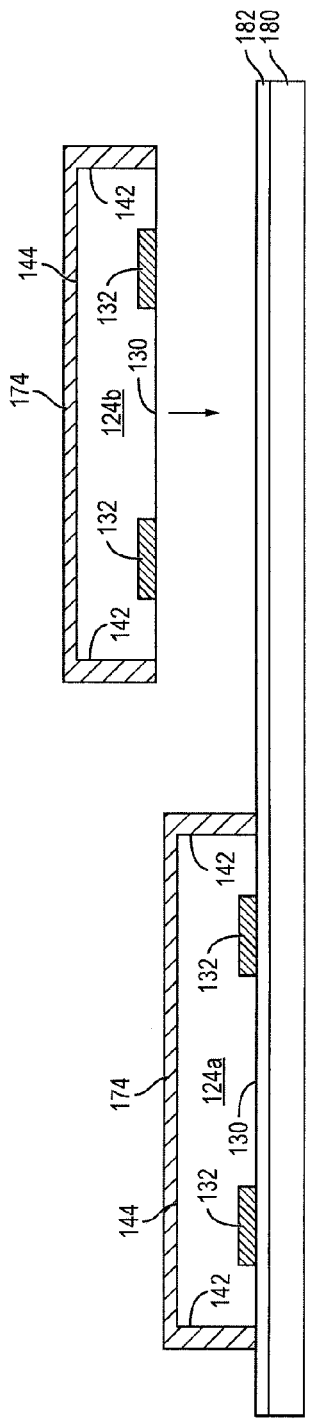

In FIG. 6e, a temporary substrate or carrier 180 contains sacrificial base material such as silicon, polymer, polymer composite, metal, ceramic, glass, glass epoxy, beryllium oxide, or other suitable low-cost, rigid material for structural support. An interface layer or tape 182 is applied over carrier 180 as a double-sided adhesive layer releasable by heat or UV light.

Figure 6F:
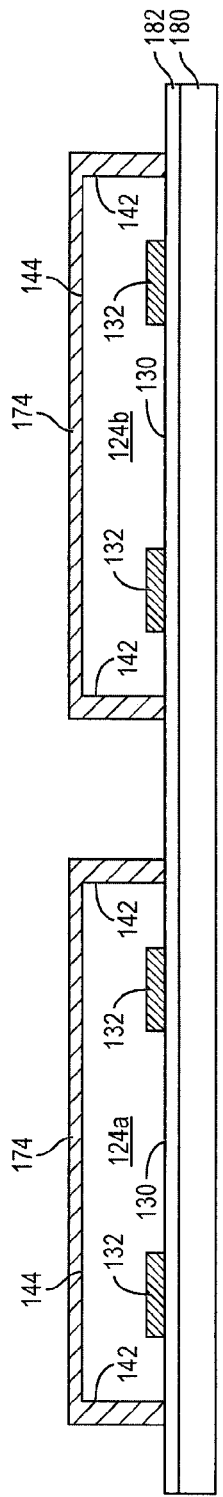

Semiconductor 124a covered by ESD protection layer 174 is removed from dicing tape 136 and mounted to interface layer 182 over carrier 180 using pick and place operation. Likewise, semiconductor 124b covered by ESD protection layer 174 is removed from dicing tape 136 and mounted to interface layer 182, as shown in FIG. 6f. The ESD protection layer 174 formed over semiconductor die 124a is discontinuous, i.e., physically separated and electrically isolated, from the ESD protection layer 174 formed over semiconductor die 124b. Semiconductor die 124a and 124b, each with discontinuous ESD protection layer 174, mounted to carrier 150 is referred to as a "reconfigured wafer."

Figure 6G:
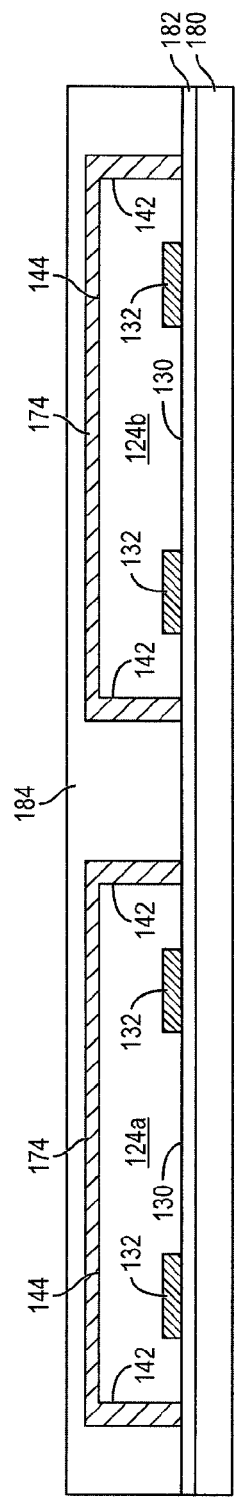

In FIG. 6g, an encapsulant or molding compound 184 is deposited over semiconductor die 124a and 124b and carrier 180 in an amount that covers ESD protection layer 174 formed over side surfaces 142 and back surface 144 of semiconductor die 124a and 124b. Encapsulant 184 is deposited using a paste printing, compressive molding, transfer molding, liquid encapsulant molding, vacuum lamination, spin coating, or other suitable applicator. Encapsulant 184 can be polymer composite material, such as epoxy resin with filler, epoxy acrylate with filler, or polymer with proper filler. Encapsulant 184 is non-conductive and environmentally protects the semiconductor device from external elements and contaminants.

Figure 6H:
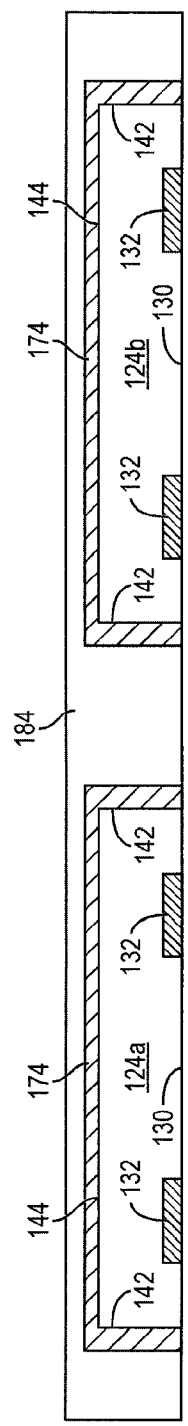

In FIG. 6h, temporary carrier 180 and interface layer 182 are removed by chemical etching, mechanical peel-off, CMP, mechanical grinding, thermal bake, UV light, laser scanning, or wet stripping.

Figure 6I:
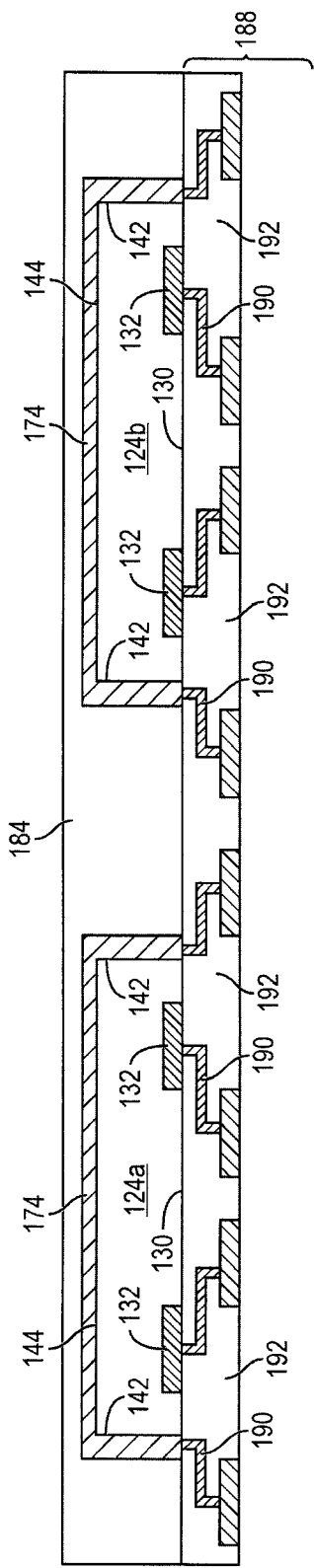

In FIG. 6i, a bottom-side build-up interconnect structure 188 is formed over active surface 130 of semiconductor die 124a and 124b and encapsulant 184. The build-up interconnect structure 188 includes an electrically conductive layer 190 formed using a patterning and metal deposition process such as sputtering, electrolytic plating, and electroless plating. Conductive layer 190 can be one or more layers of Al, Cu, Sn, Ni, Au, Ag, or other suitable electrically conductive material. One portion of conductive layer 190 is electrically connected to contact pads 132 of semiconductor die 124a and 124b. Another portion of conductive layer 190 is electrically connected to ESD protection layer 174 as a low impedance ground point. Other portions of conductive layer 190 can be electrically common or electrically isolated depending on the design and function of the semiconductor device.

The build-up interconnect structure 188 further includes an insulating or passivation layer 192 formed between conductive layers 190 and containing one or more layers of $SiO_2$, $Si_3N_4$, $SiON$, $Ta_2O_5$, $Al_2O_3$, or other material having similar insulating and structural properties. The insulating layer 192 is formed using PVD, CVD, printing, spin coating, spray coating, sintering or thermal oxidation.

Figure 6J:
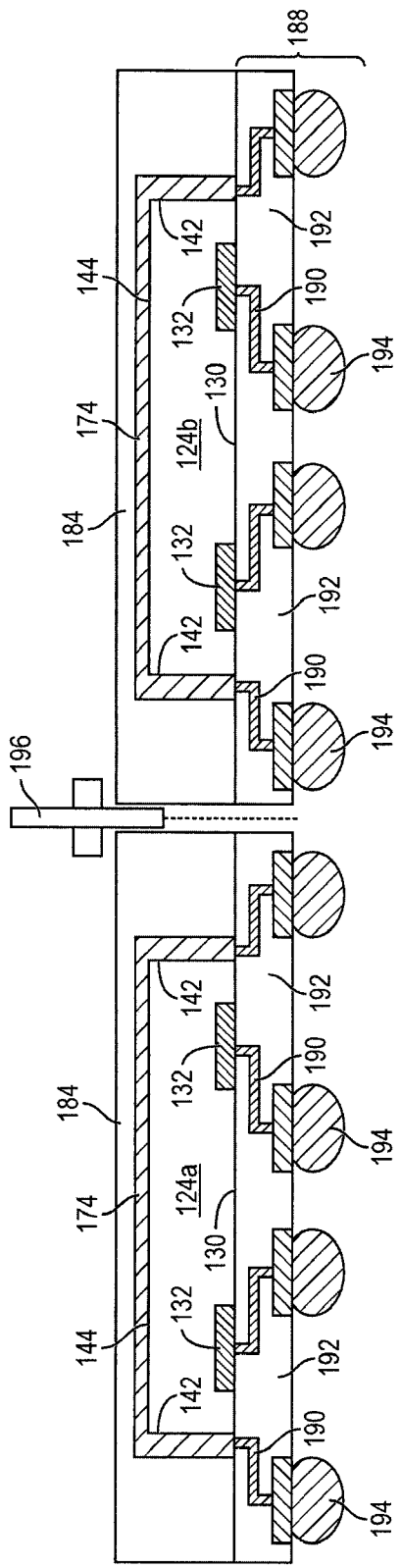

In FIG. 6j, an electrically conductive bump material is deposited over build-up interconnect structure 188 and electrically connected to conductive layer 190 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 190 using a suitable attachment or bonding process. In one embodiment, the bump material is reflowed by heating the material above its melting point to form spherical balls or bumps 194. In some applications, bumps 194 are reflowed a second time to improve electrical contact to conductive layer 190. The bumps can also be compression bonded to conductive layer 190. Bumps 194 represent one type of interconnect structure that can be formed over conductive layer 190. The interconnect structure can also use bond wires, stud bump, micro bump, or other electrical interconnect.

Semiconductor die 124a and 124b are singulated with saw blade or laser cutting tool 196 into individual semiconductor devices.

Figure 7:
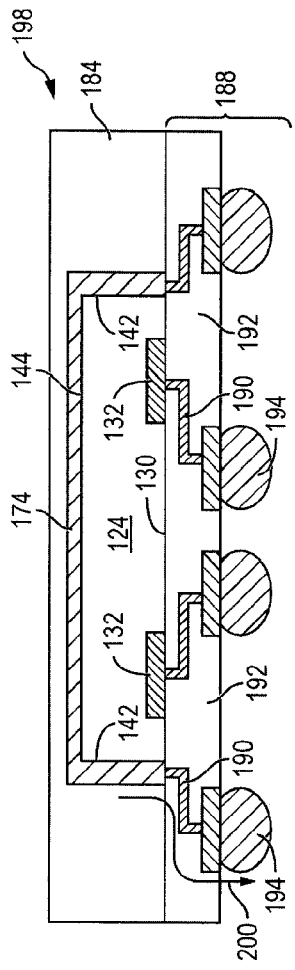
FIG. 7 illustrates the semiconductor die with the discontinuous ESD protection layer formed as encapsulant film over its side surfaces and back surface.

FIG. 7 shows semiconductor device 198 after singulation. Semiconductor die 124 is electrically connected to build-up interconnect structure 188 and bumps 194. The active and passive circuits formed within active surface 130 of semiconductor die 124 are susceptible to damage from ESD events. Electrostatic charges can accumulate, for example during removal of carrier 180 and interface layer 182. The electrostatic charges must be removed to avoid shortening the life cycle of semiconductor die 124. Encapsulant film 174 provides ESD protection for semiconductor die 124 by neutralizing the electrostatic charges. Encapsulant film 174 provides an ESD discharge path 200 through conductive layer 190 and bumps 194 to an external low-impedance ground point to safely discharge the electrostatic charges and protect semiconductor die 124. The electrostatic charges migrate toward ESD discharge path 200, which is lower resistance than a path leading to contact pads 132 and active surface 130. By depositing discontinuous ESD protection layer 174 over side surfaces 142 and back surface 144 of each semiconductor die 124, a cost effective deposition process, such as stencil printing, screen printing, spin coating, and needle dispensing, can be used.

Figure 8A:
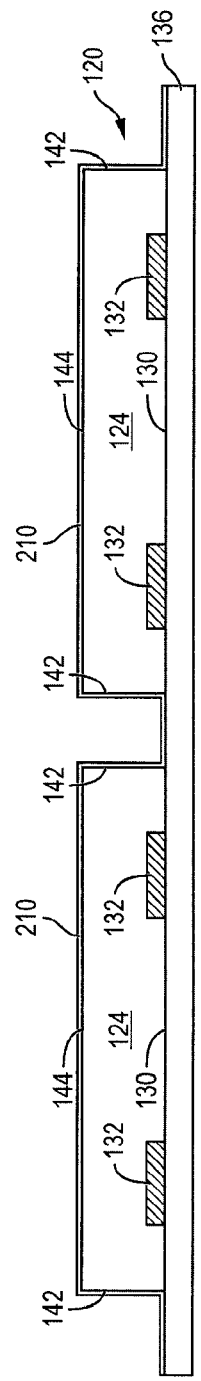
Figure 8B:
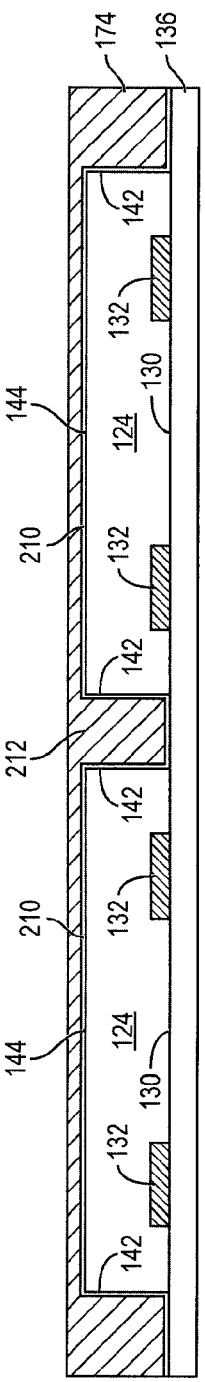

In another embodiment, continuing from FIG. 4d, an insulating or dielectric layer 210 is conformally formed over side surfaces 142 and back surface 144 of semiconductor die 124, as shown in FIG. 8a. The insulating layer 210 contains one or more layers of SiO2, Si3N4, SiON, Ta2O5, Al2O3, or other material having similar insulating and structural properties. The insulating layer 210 is formed using PVD, CVD, printing, spin coating, spray coating, sintering or thermal oxidation In FIG. 8b, a conductive layer 212 is formed over insulating layer 210, i.e., over side surfaces 142 in the singulated saw street 126 and back surface 144. In one embodiment, conductive layer 212 can be one or more layers Al, Cu, Sn, Ni, Au, Ag, or other suitable electrically conductive material. Conductive layer 212 is formed using electrolytic plating, electroless plating process, or other suitable metal deposition process. In metal form, conductive layer 212 has a thickness of 0.1 to 2.0 μm over back surface 144. Alternatively, conductive layer 212 can be an electrically conductive polymer or electrically conductive ink, i.e., polymer or ink base material with electrically conductive particles, having a thickness less than 100 μm, preferably 20-50 μm. For example, the conductive polymer can be polyacetylene, polyphenylenevinylene, polypyrrole, polythiophene, polyaniline, polyphenylene, or other organic polymer. The conductive polymer or conductive ink is formed by printing, sputtering, or vapor deposition over a metal mesh or other intermediate conductive layer formed over semiconductor die 124. Depending on the material, conductive layer 212 can also be formed by stencil printing, screen printing, spin coating, or needle dispensing. The insulating layer 210 and conductive layer 212 operate as an ESD protection layer for semiconductor die 124.

In FIG. 8c, ESD protection layer 210-212 is singulated between semiconductor die 124 down to dicing tape 136 using saw blade or laser cutting tool 214. Saw blade or laser cutting tool 214 is typically narrower than saw blade or laser cutting tool 138 so that ESD protection layer 210-212 remains covering side surfaces 142. After singulation, ESD protection layer 210-212 is discontinuous between semiconductor die 124 while still covering side surfaces 142 and back surface 144 of semiconductor die 124.

In FIG. 8d, a temporary substrate or carrier 220 contains sacrificial base material such as silicon, polymer, polymer composite, metal, ceramic, glass, glass epoxy, beryllium oxide, or other suitable low-cost, rigid material for structural support. An interface layer or tape 222 is applied over carrier 220 as a double-sided adhesive layer releasable by heat or UV light.

Semiconductor 124a with ESD protection layer 210-212 is removed from dicing tape 136 and mounted to interface layer 222 over carrier 220 using pick and place operation. Likewise, semiconductor 124b with ESD protection layer 210-212 is removed from dicing tape 136 and mounted to interface layer 222, as shown in FIG. 8e. ESD protection layer 210-212 formed over semiconductor die 124a is discontinuous, i.e., physically separated and electrically isolated, from ESD protection layer 210-212 formed over semiconductor die 124b. Semiconductor die 124a and 124b, each with discontinuous ESD protection layer 210-212, mounted to carrier 220 is referred to as a "reconfigured wafer."

Figure 8F:
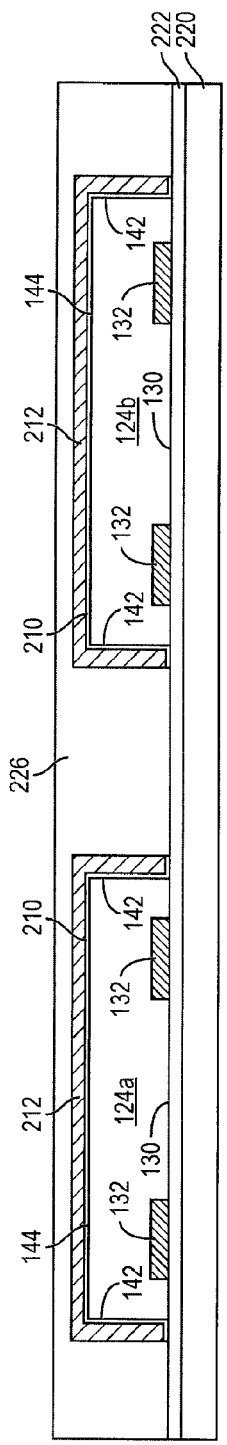

In FIG. 8f, an encapsulant or molding compound 226 is deposited over semiconductor die 124a and 124b and carrier 220 in an amount that covers ESD protection layer 210-212 formed over side surfaces 142 and back surface 144 of semiconductor die 124a and 124b. Encapsulant 226 is deposited using a paste printing, compressive molding, transfer molding, liquid encapsulant molding, vacuum lamination, spin coating, or other suitable applicator. Encapsulant 226 can be polymer composite material, such as epoxy resin with filler, epoxy acrylate with filler, or polymer with proper filler. Encapsulant 226 is non-conductive and environmentally protects the semiconductor device from external elements and contaminants.

Figure 8G:
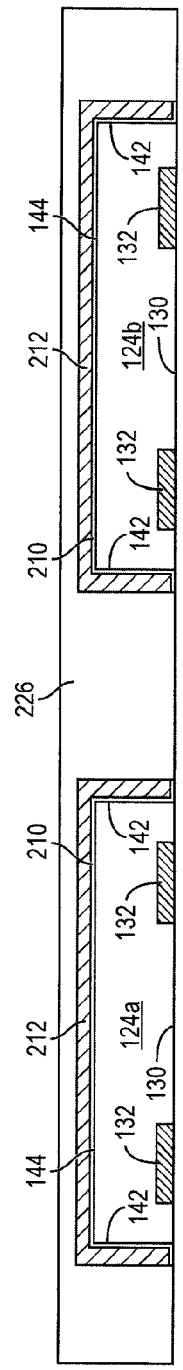

In FIG. 8g, temporary carrier 220 and interface layer 222 are removed by chemical etching, mechanical peel-off, CMP, mechanical grinding, thermal bake, UV light, laser scanning, or wet stripping.

Figure 8H:
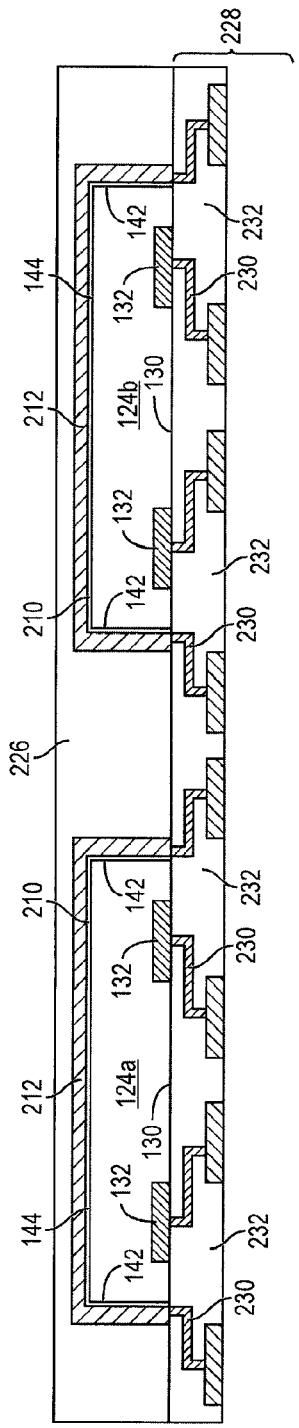

In FIG. 8h, a bottom-side build-up interconnect structure 228 is formed over active surface 130 of semiconductor die 124a and 124b and encapsulant 226. The build-up interconnect structure 228 includes an electrically conductive layer 230 formed using a patterning and metal deposition process such as PVD, CVD, sputtering, electrolytic plating, and electroless plating. Conductive layer 230 can be one or more layers of Al, Cu, Sn, Ni, Au, Ag, or other suitable electrically conductive material. One portion of conductive layer 230 is electrically connected to contact pads 132 of semiconductor die 124a and 124b. Another portion of conductive layer 230 is electrically connected to conductive layer 212 as a low impedance ground point. Other portions of conductive layer 230 can be electrically common or electrically isolated depending on the design and function of the semiconductor device.

The build-up interconnect structure 228 further includes an insulating or passivation layer 232 formed between conductive layers 230 and containing one or more layers of SiO2, Si3N4, SiON, Ta2O5, Al2O3, or other material having similar insulating and structural properties. The insulating layer 232 is formed using PVD, CVD, printing, spin coating, spray coating, sintering or thermal oxidation.

In FIG. 8i, an electrically conductive bump material is deposited over build-up interconnect structure 228 and electrically connected to conductive layer 230 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 230 using a suitable attachment or bonding process. In one embodiment, the bump material is reflowed by heating the material above its melting point to form spherical balls or bumps 234. In some applications, bumps 234 are reflowed a second time to improve electrical contact to conductive layer 230. The bumps can also be compression bonded to conductive layer 230. Bumps 234 represent one type of interconnect structure that can be formed over conductive layer 230. The interconnect structure can also use bond wires, stud bump, micro bump, or other electrical interconnect.

Semiconductor die 124a and 124b are singulated with saw blade or laser cutting tool 236 into individual semiconductor devices.

FIG. 9 shows semiconductor device 238 after singulation. Semiconductor die 124 is electrically connected to build-up interconnect structure 228 and bumps 234. The active and passive circuits formed within active surface 130 of semiconductor die 124 are susceptible to damage from ESD events. Electrostatic charges can accumulate, for example during removal of carrier 220 and interface layer 222. The electrostatic charges must be removed to avoid shortening the life cycle of semiconductor die 124. The insulating layer 210 and conductive layer 212 provides ESD protection for semiconductor die 124 by neutralizing the electrostatic charges. Conductive layer 212 provides an ESD discharge path 200 through conductive layer 230 and bumps 234 to an external low-impedance ground point to safely discharge the electrostatic charges and protect semiconductor die 124. The electrostatic charges migrate toward ESD discharge path 240, which is lower resistance than a path leading to contact pads 132 and active surface 130. By depositing discontinuous ESD protection layer 210-212 over side surfaces 142 and back surface 144 of each semiconductor die 124, a cost effective deposition process, such as stencil printing, screen printing, spin coating, and needle dispensing, can be used. In addition, insulating layer 210 and conductive layer 212 act as a shielding layer to suppress electromagnetic interference (EMI) and radio frequency interference (RFI). The insulating layer 210 also prevents electrical shorting between conductive layer 212 and semiconductor die 124.

FIG. 10 shows two side-by-side semiconductor die 124 each with an ESD protective layer 140 mounted to interconnect structure 158.

FIG. 11 shows two side-by-side semiconductor die 124, one die with ESD protective layer 140 and one die without ESD protective layer 140, mounted to interconnect structure 158.

Figure 12:
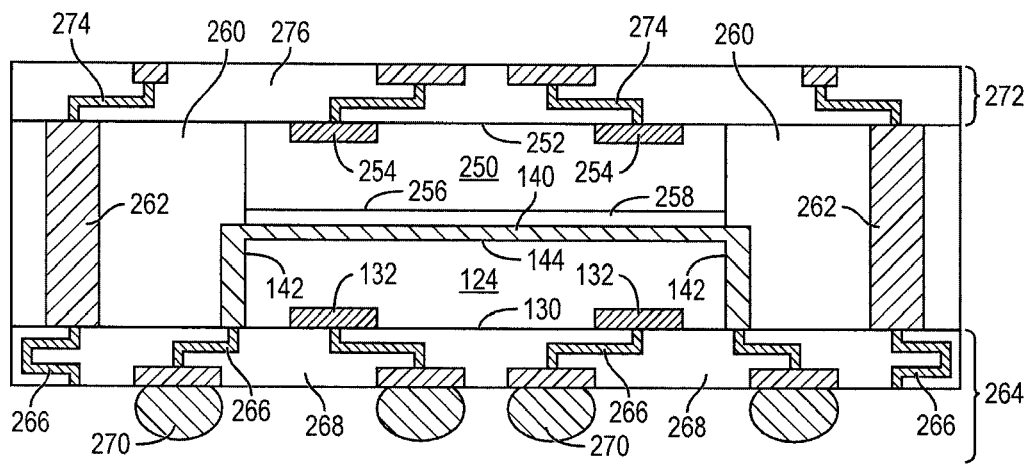
FIG. 12 illustrates stacked semiconductor die, one die covered by the discontinuous ESD protection layer and one die without the ESD protection layer.

FIG. 12 shows an embodiment, continuing from FIG. 4h, with semiconductor die 124 covered by ESD protection layer 140 mounted to the temporary carrier. A semiconductor die 250 has an active surface 252 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 252 to implement analog circuits or digital circuits, such as DSP, ASIC, memory, or other signal processing circuit. Semiconductor die 252 may also contain IPDs, such as inductors, capacitors, and resistors, for RF signal processing. A plurality of contact pads 254 is formed over active surface 252. A back surface 256 of semiconductor die 250 is mounted to ESD protection layer 140 over back surface 144 of semiconductor die 124 with adhesive layer 258.

An encapsulant or molding compound 260 is deposited over semiconductor die 124 and 250 and the carrier using a paste printing, compressive molding, transfer molding, liquid encapsulant molding, vacuum lamination, spin coating, or other suitable applicator. Encapsulant 260 can be polymer composite material, such as epoxy resin with filler, epoxy acrylate with filler, or polymer with proper filler. Encapsulant 260 is non-conductive and environmentally protects the semiconductor device from external elements and contaminants.

A plurality of vias is formed through encapsulant 260 using laser drilling, mechanical drilling, or deep reactive ion etching (DRIE). The vias are filled with Al, Cu, Sn, Ni, Au, Ag, Ti, tungsten (W), poly-silicon, or other suitable electrically conductive material using electrolytic plating, electroless plating process, or other suitable metal deposition process to form conductive vias 262.

The temporary carrier is removed by chemical etching, mechanical peel-off, CMP, mechanical grinding, thermal bake, UV light, laser scanning, or wet stripping.

A bottom-side build-up interconnect structure 264 is formed over active surface 130 of semiconductor die 124 and encapsulant 260. The build-up interconnect structure 264 includes an electrically conductive layer 266 formed using a patterning and metal deposition process such as PVD, CVD, sputtering, electrolytic plating, and electroless plating. Conductive layer 266 can be one or more layers of Al, Cu, Sn, Ni, Au, Ag, or other suitable electrically conductive material. One portion of conductive layer 266 is electrically connected to contact pads 132 of semiconductor die 124. Another portion of conductive layer 266 is electrically connected to ESD protection layer 140 as a low impedance ground point. Another portion of conductive layer 266 is electrically connected to conductive vias 262. Other portions of conductive layer 266 can be electrically common or electrically isolated depending on the design and function of the semiconductor device.

The build-up interconnect structure 264 further includes an insulating or passivation layer 268 formed between conductive layers 266 and containing one or more layers of SiO2, Si3N4, SiON, Ta2O5, Al2O3, or other material having similar insulating and structural properties. The insulating layer 268 is formed using PVD, CVD, printing, spin coating, spray coating, sintering or thermal oxidation. A plurality of bumps 270 is formed over conductive layer 266.

A top-side build-up interconnect structure 272 is formed over active surface 252 of semiconductor die 250 and encapsulant 260. The build-up interconnect structure 272 includes an electrically conductive layer 274 formed using a patterning and metal deposition process such as PVD, CVD, sputtering, electrolytic plating, and electroless plating. Conductive layer 274 can be one or more layers of Al, Cu, Sn, Ni, Au, Ag, or other suitable electrically conductive material. One portion of conductive layer 274 is electrically connected to contact pads 254 of semiconductor die 250. Another portion of conductive layer 274 is electrically connected to conductive vias 262. Other portions of conductive layer 274 can be electrically common or electrically isolated depending on the design and function of the semiconductor device.

The build-up interconnect structure 272 further includes an insulating or passivation layer 276 formed between conductive layers 274 and containing one or more layers of SiO2, Si3N4, SiON, Ta2O5, Al2O3, or other material having similar insulating and structural properties. The insulating layer 276 is formed using PVD, CVD, printing, spin coating, spray coating, sintering or thermal oxidation.

Figure 13:
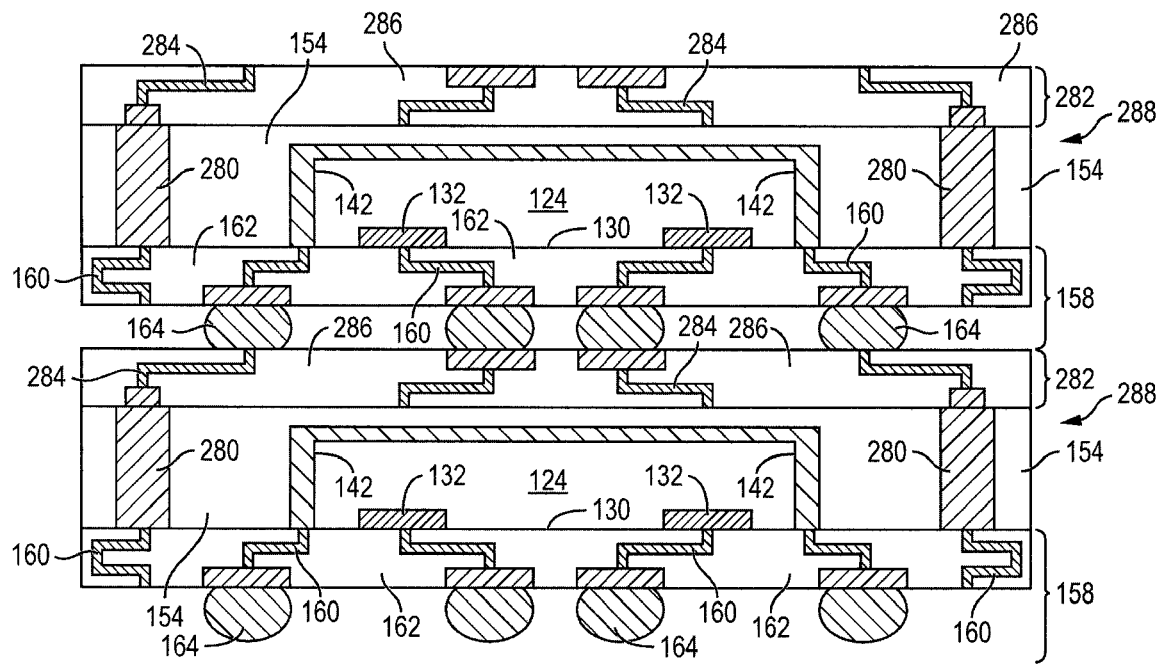
FIG. 13 illustrates stacked semiconductor die, each die covered by the discontinuous ESD protection layer.

FIG. 13 shows an embodiment, continuing from FIG. 5, with a plurality of vias is formed through encapsulant 154 using laser drilling, mechanical drilling, or DRIE. The vias are filled with Al, Cu, Sn, Ni, Au, Ag, Ti, W, poly-silicon, or other suitable electrically conductive material using electrolytic plating, electroless plating process, or other suitable metal deposition process to form conductive vias 280.

A top-side build-up interconnect structure 282 is formed over encapsulant 154. The build-up interconnect structure 282 includes an electrically conductive layer 284 formed using a patterning and metal deposition process such as PVD, CVD, sputtering, electrolytic plating, and electroless plating. Conductive layer 284 can be one or more layers of Al, Cu, Sn, Ni, Au, Ag, or other suitable electrically conductive material. One portion of conductive layer 284 is electrically connected to conductive vias 280. Other portions of conductive layer 274 can be electrically common or electrically isolated depending on the design and function of the semiconductor device.

The build-up interconnect structure 282 further includes an insulating or passivation layer 286 formed between conductive layers 284 and containing one or more layers of SiO2, Si3N4, SiON, Ta2O5, Al2O3, or other material having similar insulating and structural properties. The insulating layer 286 is formed using PVD, CVD, printing, spin coating, spray coating, sintering or thermal oxidation.

Semiconductor device 288 includes semiconductor die 124 covered by ESD protective layer 140 and electrically connected to build-up interconnect structures 158 and 282 and bumps 164. Conductive layer 140 provides ESD protection for semiconductor die 124. Two semiconductor devices 288 are stacked and electrically connected through interconnect structures 158 and 282 and bumps 164.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a plurality of semiconductor die;
   an electrostatic discharge (ESD) protection layer disposed on a first surface of the semiconductor die and side surfaces of the semiconductor die, the ESD protection layer being discontinuous and electrically isolated between the semiconductor die;
   an encapsulant deposited over the semiconductor die to completely enclose the ESD protection layer on the side surfaces of the semiconductor die; and
   an interconnect structure formed over the encapsulant and a second surface of the semiconductor die opposite the first surface of the semiconductor die, the ESD protection layer being electrically connected to the interconnect structure to provide an ESD path.

2. The semiconductor device of claim 1, wherein the ESD protection layer includes:
   an insulating layer formed over the first surface of the semiconductor die and around the side surfaces of the semiconductor die; and
   a conductive layer formed over the insulating layer.

3. The semiconductor device of claim 1, wherein the ESD protection layer includes an encapsulant film, conductive polymer, or conductive ink formed over the first surface of the semiconductor die and around the side surfaces of the semiconductor die.

4. The semiconductor device of claim 1, further including a conductive via formed through the encapsulant.

5. The semiconductor device of claim 1, further including a plurality of stacked semiconductor die covered by the ESD protective layer.

6. A semiconductor device, comprising:
   a plurality of semiconductor die;
   an electrostatic discharge (ESD) protection layer disposed over a first surface of the semiconductor die and on side surfaces of the semiconductor die, the ESD protection layer being discontinuous between the semiconductor die; and
   an encapsulant deposited over the semiconductor die to enclose the ESD protection layer.

7. The semiconductor device of claim 6, further including an interconnect structure formed over the encapsulant and a second surface of the semiconductor die opposite the first surface of the semiconductor die.

8. The semiconductor device of claim 6, wherein the ESD protection layer includes:
   an insulating layer; and
   a conductive layer formed over the insulating layer.

9. The semiconductor device of claim 6, wherein the ESD protection layer includes:
   an insulating layer formed over the first surface of the semiconductor die and around the side surfaces of the semiconductor die; and
   a conductive layer formed over the insulating layer.

10. The semiconductor device of claim 6, wherein the ESD protection layer includes an encapsulant film, conductive polymer, or conductive ink formed over the first surface of the semiconductor die and around the side surfaces of the semiconductor die.

11. The semiconductor device of claim 6, further including a conductive via formed through the encapsulant.

12. The semiconductor device of claim 6, further including a plurality of stacked semiconductor die covered by the ESD protective layer and electrically connected.

13. The semiconductor device of claim 7, wherein the ESD protection layer is electrically connected to the interconnect structure to provide an ESD path.

14. A semiconductor device, comprising:
   a first semiconductor die;
   an electrostatic discharge (ESD) protection layer disposed over a first surface of the first semiconductor die and around side surfaces of the first semiconductor die;
   an encapsulant deposited over the first semiconductor die to enclose the ESD protection layer around the side surfaces of the first semiconductor die; and
   a conductive via formed through the encapsulant.

15. The semiconductor device of claim 14, further including an interconnect structure formed over the encapsulant and a second surface of the first semiconductor die opposite the first surface of the first semiconductor die.

16. The semiconductor device of claim 14, wherein the ESD protection layer includes:
   an insulating layer formed over the first surface of the first semiconductor die and around the side surfaces of the first semiconductor die; and
   a conductive layer formed over the insulating layer.

17. The semiconductor device of claim 14, wherein the ESD protection layer includes an encapsulant film, conductive polymer, or conductive ink formed over the first surface of the first semiconductor die and around the side surfaces of the first semiconductor die.

18. The semiconductor device of claim 14, further including a second semiconductor die without the ESD protection layer disposed adjacent to or disposed over the first semiconductor die.

19. The semiconductor device of claim 15, wherein the ESD protection layer is electrically connected to the interconnect structure to provide an ESD path.

20. A semiconductor device, comprising:
   a first semiconductor die;
   an electrostatic discharge (ESD) protection layer disposed over a first surface of the first semiconductor die and around side surfaces of the first semiconductor die, the ESD protection layer terminating at the side surfaces of the first semiconductor die; and an encapsulant deposited over the ESD protection layer.

21. The semiconductor device of claim 20, further including an interconnect structure formed over the encapsulant and a second surface of the first semiconductor die opposite the first surface of the first semiconductor die.

22. The semiconductor device of claim 20, further including a conductive via formed through the encapsulant.

23. The semiconductor device of claim 20, wherein the ESD protection layer includes:

an insulating layer formed over the first surface of the first semiconductor die and around the side surfaces of the first semiconductor die; and a conductive layer formed over the insulating layer.

24. The semiconductor device of claim 20, further including a second semiconductor die without the ESD protection layer disposed adjacent to or disposed over the first semiconductor die.

25. The semiconductor device of claim 21, wherein the ESD protection layer is electrically connected to the interconnect structure to provide an ESD path.

* * * * *